United States Patent
May

(10) Patent No.: US 7,202,750 B2
(45) Date of Patent: Apr. 10, 2007

(54) CONTROLLABLE PHASE LOCKED LOOP VIA ADJUSTABLE DELAY AND METHOD FOR PRODUCING AN OUTPUT OSCILLATION FOR USE THEREWITH

(75) Inventor: Michael R. May, Austin, TX (US)

(73) Assignee: Sigmatel, Inc., Austin, TX (US)

( * ) Notice: Subject to any disclaimer, the term of this patent is extended or adjusted under 35 U.S.C. 154(b) by 108 days.

(21) Appl. No.: 11/153,144

(22) Filed: Jun. 15, 2005

(65) Prior Publication Data

US 2006/0255868 A1    Nov. 16, 2006

Related U.S. Application Data

(63) Continuation-in-part of application No. 11/126,553, filed on May 11, 2005.

(51) Int. Cl.
*H03L 7/081* (2006.01)
*H03L 7/099* (2006.01)

(52) U.S. Cl. ............................ 331/1 A; 331/16; 331/34

(58) Field of Classification Search ................ 331/1 A, 331/16–18, 25, 34; 327/156–159; 375/376; 455/260
See application file for complete search history.

(56) References Cited

U.S. PATENT DOCUMENTS 5,059,924 A * 10/1991 JenningsCheck ............ 331/1 A
5,394,116 A *  2/1995 Kasturia ...................... 331/34

OTHER PUBLICATIONS

Chan-Hong Park, et al; A 1.8-GHz Self-Calibrated Phase-Locked Loop with Precise I/Q Matching; IEEE Journal of Solid-State Circuits, vol. 36, No. 5, May 2001; pp. 777-783.

* cited by examiner

*Primary Examiner*—David Mis
(74) *Attorney, Agent, or Firm*—Garlick Harrison & Markison; Timothy W. Markison

(57) ABSTRACT

A phase locked loop circuit is implemented with difference detection module that produces a difference signal based on at least one of phase difference and frequency difference between a reference oscillation and a feedback oscillation. A loop filter module converts the difference signal into a control signal. A controlled oscillation module converts the control signal into an output oscillation. An output oscillation adjust module, coupled to the controlled oscillation module, produces an effective output oscillation based on an oscillation control signal. A divider module converts the effective output oscillation into the divided oscillation. A delay adjust module provides an adjustable delay to produce the feedback oscillation.

48 Claims, 16 Drawing Sheets

Look-up table 552

| Tap # | Variable delay adjust |
|---|---|
| 1 | $d_1$ |
| 2 | $d_2$ |
| ... | ... |
| x | $d_x$ |

| Tap # | | Selected divisor N | | |
|---|---|---|---|---|
| | 1 | ... | n | |
| 1 | | ... | $d_{1,n}$ | |
| 2 | | ... | $d_{2,n}$ | |
| ... | | ... | ... | |
| x | | ... | $d_{2,x}$ | |

Look-up table 560

CONTROLLABLE PHASE LOCKED LOOP VIA ADJUSTABLE DELAY AND METHOD FOR PRODUCING AN OUTPUT OSCILLATION FOR USE THEREWITH

CROSS REFERENCE TO RELATED APPLICATIONS

The present invention is a continuation-in-part of commonly assigned application, U.S. Ser. No. 11/126,553, May 11, 2005, CONTROLLABLE PHASE LOCKED LOOP AND METHOD FOR PRODUCING AN OUTPUT OSCILLATION FOR USE THEREWITH.

TECHNICAL FIELD OF THE INVENTION

The present invention relates to oscillators, phase locked loop circuits, the application of these circuits to radio receivers and related methods.

DESCRIPTION OF RELATED ART

Phase locked loop circuits are employed in applications such as radio receivers for demodulating frequency and phase modulated radio signals and further in the design of local oscillators used for demodulating radio signals. One concern in the design of these circuits is the amount of noise that is produced. When implemented in a radio receiver, it is desirable for the output noise of these circuits to be as low as possible. Digital circuit designs can reduce the amount of analog noise, such as thermal noise that is introduced. However, digital circuits produce a certain amount phase/frequency jitter that is recognized as noise on the output.

Prior art designs have utilized inductors for increasing the oscillation frequency of the voltage controlled oscillator (VCO) in order to accomplish a low jitter. One method to produce a high frequency VCO includes the use of inductors. However, it is often desirable to implement phase locked loop circuitry in an integrated circuit (IC). While inductive elements can be implemented in an IC, these circuit elements require a great deal of space on the IC that either necessitate the design of larger chips or of reduced space for other circuit components. In addition, greater VCO oscillation frequencies require larger dividers that consume more power.

Prior art phase locked loop circuits have employing fractional dividers to provide a greater control over output frequencies. However, these circuits also introduce phase/frequency jitter that is recognized as noise on the output.

The need exists for a low noise phase locked loop circuit that can be implemented efficiently on an IC. The need further exists for a phase locked loop circuit that can be quickly and accurately adjusted to an output frequency.

BRIEF DESCRIPTION OF THE SEVERAL VIEWS OF THE DRAWINGS

FIG. 7 presents a block diagram representation of a memory device in accordance with an embodiment of the present invention;

FIG. 8 presents a block diagram representation of a memory device in accordance with an alternative embodiment of the present invention;

DETAILED DESCRIPTION OF THE INVENTION INCLUDING THE PRESENTLY PREFERRED EMBODIMENTS

The embodiments of the present invention yield several advantages over the prior art. In an embodiment, fine adjustments of the output frequency of a phase locked loop can be accomplished by adjusting a time delay of the output oscillation in order to form an effective output oscillation that is used in the feedback loop. In a further embodiment, a ring oscillator that includes a plurality of delay stages with a corresponding plurality of taps is used to implement the VCO. In this embodiment, the delay of each buffer is used to generate adjustments to the output frequency. In this fashion, finer frequency adjustments are possible in an inductorless design.

It is recognized that adjusting the output oscillation using time adjustments derived from the tap delays of a ring oscillator, may introduce jitter and therefore noise onto output oscillation, if the time delays corresponding to the delay stages are not equal to one another. A variable delay control generator is introduced that generates a variable delay control signal that represents a particular delay adjustment, for the particular tap that is currently selected. The feedback oscillation used in the phase locked loop is adjusted based on this variable delay control signal. This structure, and the corresponding method disclosed herein, correct for this buffer time delay variation and result in a low noise design.

Figure 1:
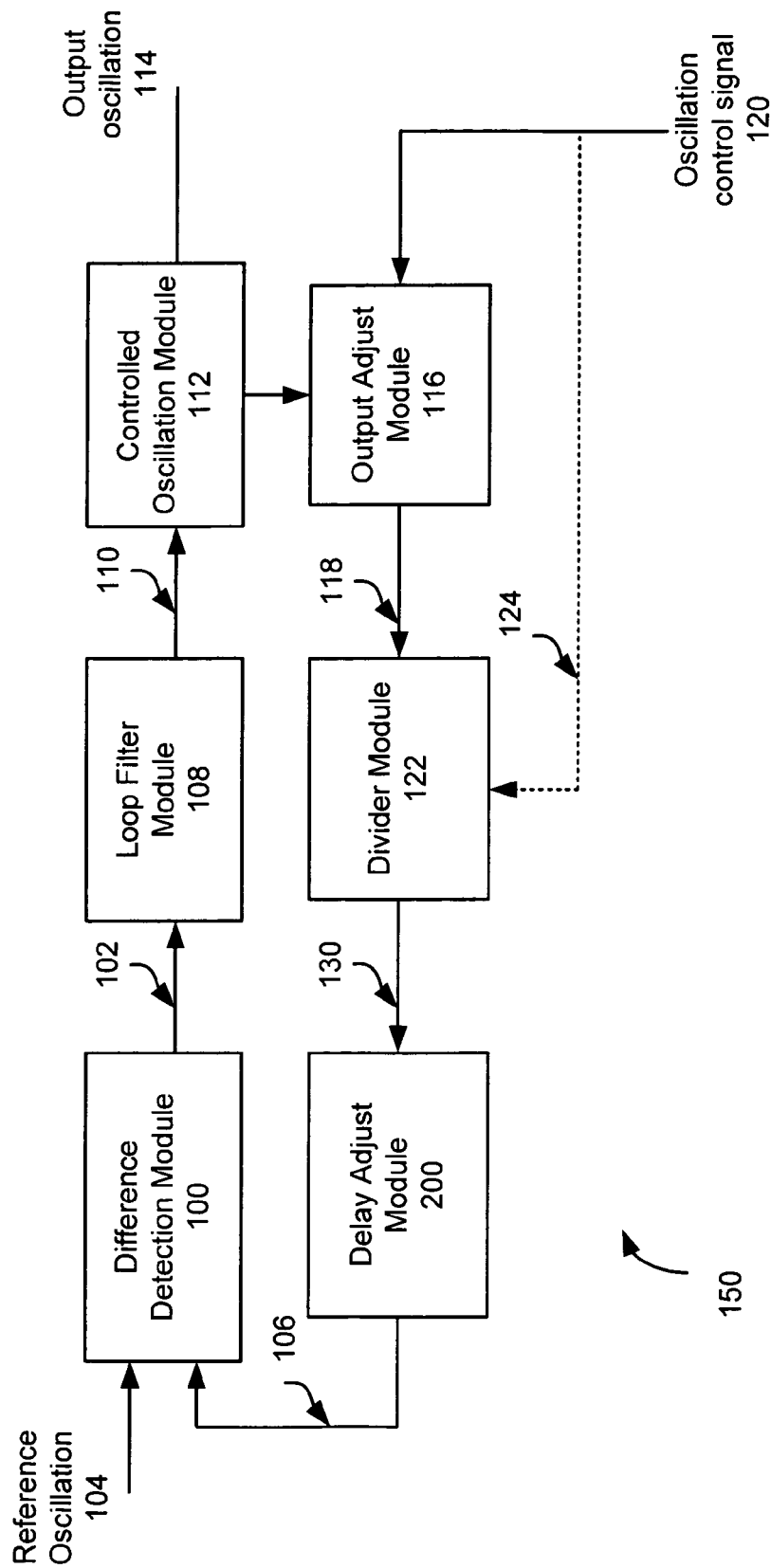
FIG. 1 presents a block diagram representation of a phase locked loop in accordance with an embodiment of the present invention.

FIG. 1 presents a block diagram representation of a phase locked loop in accordance with an embodiment of the present invention. In particular, a phase locked loop circuit 150 is implemented with difference detection module 100 operably coupled to determine a difference signal 102 based on at least one of a phase difference and a frequency difference between a reference oscillation 104 and a feedback oscillation 106. A loop filter module 108 is operably coupled to convert the difference signal 102 into a control signal 110. A controlled oscillation module 112 is operably coupled to convert the control signal 110 into an output oscillation 114. An output oscillation adjust module 116 is operably coupled to the controlled oscillation module 112 to produce an effective output oscillation 118 based on an oscillation control signal 120. A divider module 122 is operably coupled to convert the effective output oscillation 118 into the divided oscillation 130. Delay adjust module 200 is operably coupled to a divider module 122 for producing the feedback oscillation 106. In particular, delay adjust module 200 serves to adjust the leading and/or the trailing edge of the divided oscillation 130 in order to reduce jitter.

In an embodiment of the present invention, divider module 122 can be a fixed divider that produces divided oscillation 130 by dividing the frequency of effective output oscillation 118 by a constant value. In other embodiments of the present invention, divider module 122 is responsive to oscillation control signal 120, via optional connection 124, to divide the effective oscillation output 118 by a selected divisor.

In accordance with an embodiment of the present invention, the difference detection module 100 is implemented with a phase sensitive detector whose output current is proportional to the difference in phase between the feedback oscillation 106 and the reference oscillation 104. Loop filter module 108 includes an RC series connection to ground with the voltage across the RC series combination providing control signal 110 that is coupled to controlled oscillation module 112. In this embodiment, the control signal 110 is a scaled version of the difference signal 102 plus a scaled and integrated version of the difference signal 102. In accordance with an embodiment of the present invention, controlled oscillation module 112 includes a voltage controlled oscillator that produces output oscillation 114 with an output frequency that is responsive to the voltage of control signal 110 from the loop filter module 108. In a preferred embodiment of the present invention, difference detection module 100 and loop filter module 108 are implemented by digital circuits, however, analog circuit implementations are likewise possible as will be understood by one of ordinary skill in the art.

In accordance with an embodiment of the present invention, output oscillation adjust module 116 modifies the output oscillation 114 by periodically adjusting the output oscillation frequency. In one embodiment of the present invention, the output oscillation adjust module periodically adjusts the period of oscillation, by subtracting or adding a time delay to the output oscillation 114.

In operation, the phase locked loop operates to lock the edges of the feedback oscillation 106 to the edges of the reference oscillation 104. The frequency division of divider module 122 provides a change in frequency by a divisor N, which is either a constant value or a selected divisor value that is chosen based on the oscillation control signal 120.

The frequency of the effective output oscillation 118, $F_{eo}$ can therefore be represented in terms of the frequency of the feedback oscillation 106, as:

$$F_{eo}=NF_{fb}$$

Because the frequency of the feedback oscillation 106 is locked to the frequency of the reference oscillation 104, $F_{ref}$, $$F_{eo}=NF_{ref}$$

In an embodiment of the present invention, divider module N is implemented using counters, shift registers and/or D flip-flops and divisor N is an integer value. However, in accordance with an alternative embodiment, divider module 122 can be implemented using a fractional divider as will be understood by one skilled in the art based on the teachings described herein. In this alternative embodiment, N takes on a real number that includes a fractional component. In an example implementation in accordance with this embodiment, a fractional N PLL is used to generate this real number.

In an embodiment, the effective output oscillation 118 is formed by periodically advancing the output oscillation 114 by a time period $T_{adv}$. In this case, the effective output oscillation frequency $F_{eo}$ is greater than the output oscillation frequency. Further, in a preferred embodiment, the time period of the adjustment is relatively small in comparison with the time period of the output oscillation 114 and in particular, $$(F_{eo}-F_o)/F_o<0.5.$$

In an alternative embodiment, the output oscillation adjust module 116 can either add or subtract a time delay to the output oscillation 114. In this embodiment, $$|F_{eo}-F_o|/F_o<0.5$$

Figure 2:
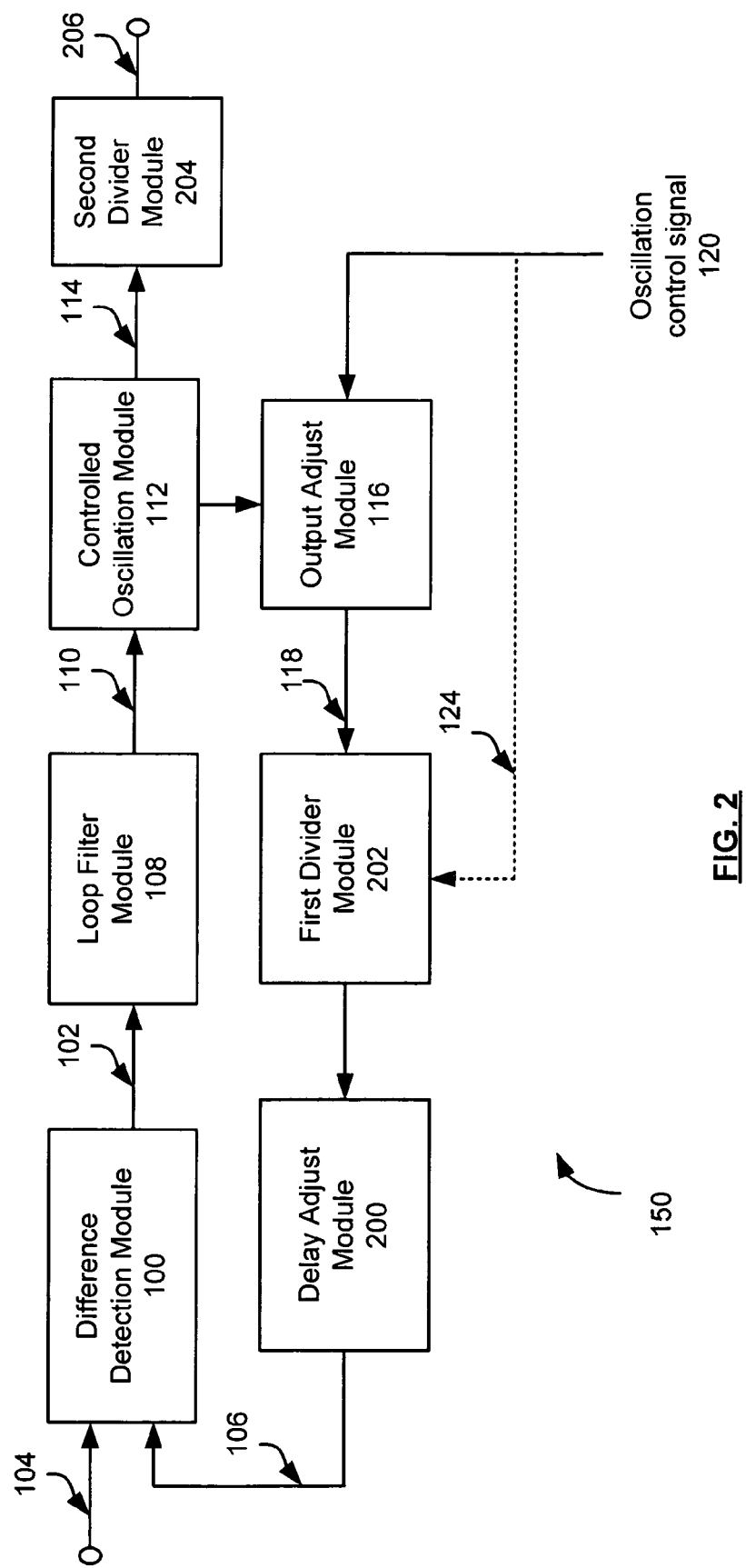
FIG. 2 presents a block diagram representation of a phase locked loop in accordance with a further embodiment of the present invention.

FIG. 2 presents a block diagram representation of a phase locked loop in accordance with a further embodiment of the present invention. In particular, an alternative embodiment of phase locked loop 150 is presented. As adopted through the description presented herein, like components are represented by common reference numerals. A second divider module 204 further divides the output oscillation 114 by a divisor M to produce a divided output oscillation 206.

Figure 3:
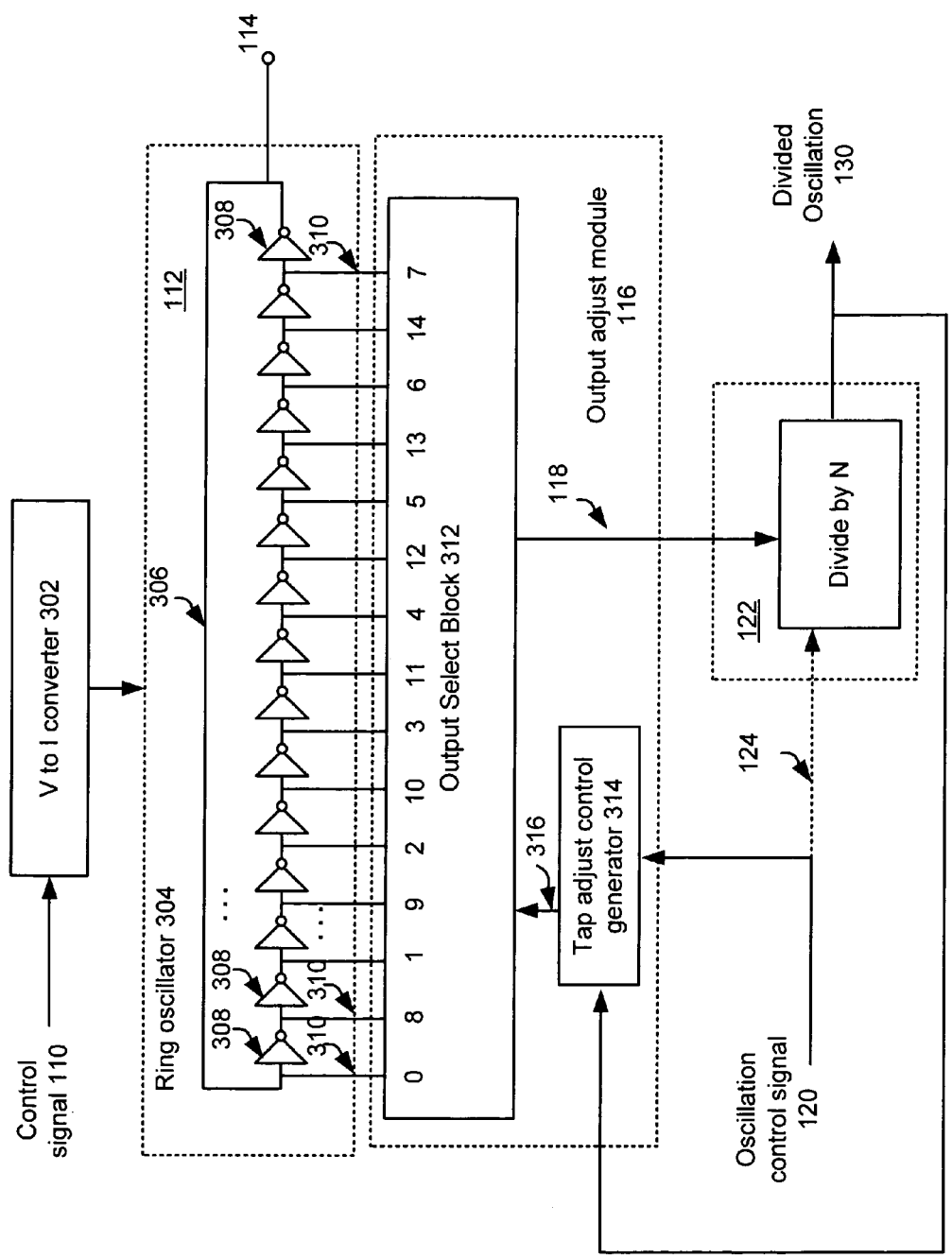
FIG. 3 presents a block diagram representation of a controlled oscillation module in accordance with an embodiment of the present invention.

FIG. 3 presents a block diagram representation of a controlled oscillation module in accordance with an embodiment of the present invention. In particular, one possible implementation is presented for controlled oscillation module 112, output adjust module 116, and divider module 122. In this implementation, controlled oscillation module 112 includes a voltage controlled oscillator that includes a V to I converter 302 for converting the control voltage into a current signal of ring oscillator 304. In a preferred embodiment, ring oscillator 304 is a current controlled oscillator having a plurality of delay stages 308, a feedback loop 306 and a plurality of taps 310 coupled to a corresponding plurality of outputs of the plurality of delay stages. In the implementation shown, 15 inverting delay stages 308 are included. However, other implementations may include any odd number of inverters in conjunction with any number of non-inverting delay stages. In an embodiment where loop filter module 108 is implemented using a digital filter, control output 110 is a digital signal and V to I converter 302 includes a digital to analog converter, converting the digital control signal into an analog current signal for controlling the frequency of ring oscillator 304.

Output oscillation adjust module 116 includes an output select block 312, operably coupled to the plurality of taps 310 of ring oscillator 304, for producing the effective output oscillation 118 from one of the plurality of taps 310. Output oscillation adjust module 116 further includes a tap adjust control generator 314, responsive to the oscillation control signal 120 for generating a sequence of tap adjust control signals 316 that command the output select block to select a corresponding sequence of selected taps from the plurality of taps. In a preferred embodiment, output select block 312 is implemented using a digital multiplexer circuit whose output is a selected one of the plurality of inputs. In accordance with a preferred embodiment, output select block 312 receives a 4-bit control input 316. The inputs 0–14 correspond to alternating tap outputs as shown in FIG. 3. Given that the delay stages 308 are implemented using inverters, this produces an output for taps 0–7 that are in-phase and an output for taps 8–14 whose phase is inverted.

In a preferred embodiment of the present invention, the divider module 122 includes a controllable divide by N circuit that divides the effective output oscillation 118 by a selected divisor N, where N is an integer in the range from 48–79, and where N is selected based on a 5-bit input from oscillation control signal 120. One of ordinary skill in the art will recognize, based on the teachings of the present invention, that other ranges of N could likewise be implemented. In an alternative embodiment described in conjunction with FIG. 1, wherein N is a real number that includes a fractional component, oscillation control signal 120 includes a larger number of bits to represent a greater selection of mixed numbers including both integer and fractional components.

In an embodiment of the present invention, the effective output oscillation 118 is formed by periodically advancing the output oscillation 114 by a time period $T_{adv}$, using the output select block 312 to shift the selected tap 310. Assuming that each of the delay stages 308 have a corresponding delay d, a shift of the output forward y taps creates an effective output oscillation 118 which is advanced in time from output oscillation 114 by an amount:

$$T_{adv} = yd$$

Consider the operation of these components in light of an illustrative example. Consider a reference frequency, $F_{ref}=12$ Mhz and consider a desired output frequency, $F_o=608$ MHz. Also consider a ring oscillator with 15 delay stages and 15 corresponding taps. Selecting a divisor N=51 comes close to the required output frequency, $F_{eo}=NF_{ref}=51$ (12 Mhz)=612 MHz. However, a divisor of 50⅔ is what is actually required. A divisor N=51 can be used if the output frequency can be slightly adjusted, by advancing the period of ring oscillator, $T_{ro}$ by ⅓ of an output frequency period, for each period of the reference frequency. Because the delay of each tap d, is equal to $$d = T_{ro}/2(\text{the number of taps}) = T_{ro}/30$$

Periodically advancing the tap selection by (10 taps)/(30 taps) provides a ⅓ period advance that creates a effective output oscillation frequency of 612 MHz from the 608 MHz output oscillation 114. In this example, oscillation control signals serves to select a divisor of 51 for divider module 122 and further selects a period tap advance of 10 taps. Since incrementing the tap index corresponds to two delay stages, a tap period advance of 10 taps corresponds to incrementing the tap index by 5. Tap adjust control generator 314 then generates corresponding sequence of tap adjust control signals to implement this advance.

Figure 4:
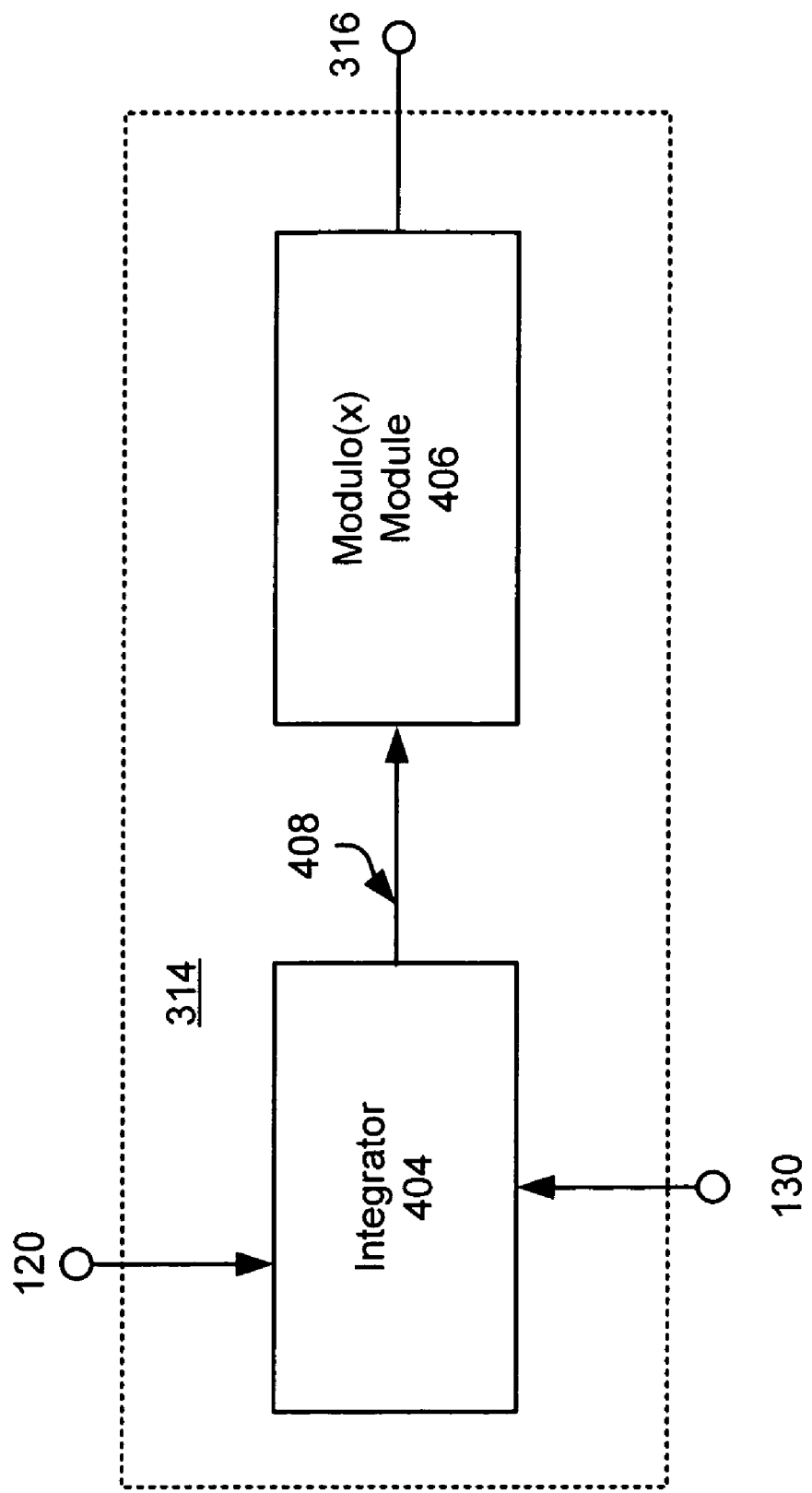
FIG. 4 presents a block diagram representation of a tap adjust control generator in accordance with an embodiment of the present invention.

FIG. 4 presents a block diagram representation of a tap adjust control generator in accordance with an embodiment of the present invention. A particular implementation of the tap adjust control generator 314 is presented. In a preferred embodiment, tap adjust control generator 314 includes an integrator 404 having an integrator output 408, responsive to the oscillation control signal 120 and the feedback oscillation 106, and a modulo(x) module 406 for producing the sequence of tap adjust signals based on the integrator output. In an alternative embodiment, reference oscillation 104 replaces feedback oscillation 106 as an input to tap adjust control generator 314. In a preferred embodiment, the value x is chosen as the number of taps in ring oscillator 304. Considering again the example discussed in conjunction with FIG. 3, an oscillation control signal 120 corresponding to a 5 tap advance is integrated by integrator 404 (an input of 15−5=10, because the input is advanced in time) that is clocked at reference oscillation 104. In this circumstance, the output 408 is the following sequence:

10, 20, 30, 40, 50, 60, 70, 80, 90, . . .

When processed by modulo(x) module 406, where x=15, the sequence of tap adjust control signals 316 becomes:

10, 5, 0, 10, 5, 0, 10, 5, 0, . . .

In terms of the 4-bit digital output, the sequence of tap adjust control signals 316 becomes:

1010, 0101, 0000, 1010, 0101, 0000, 1010, 0101, 0000, . . .

Figure 5:
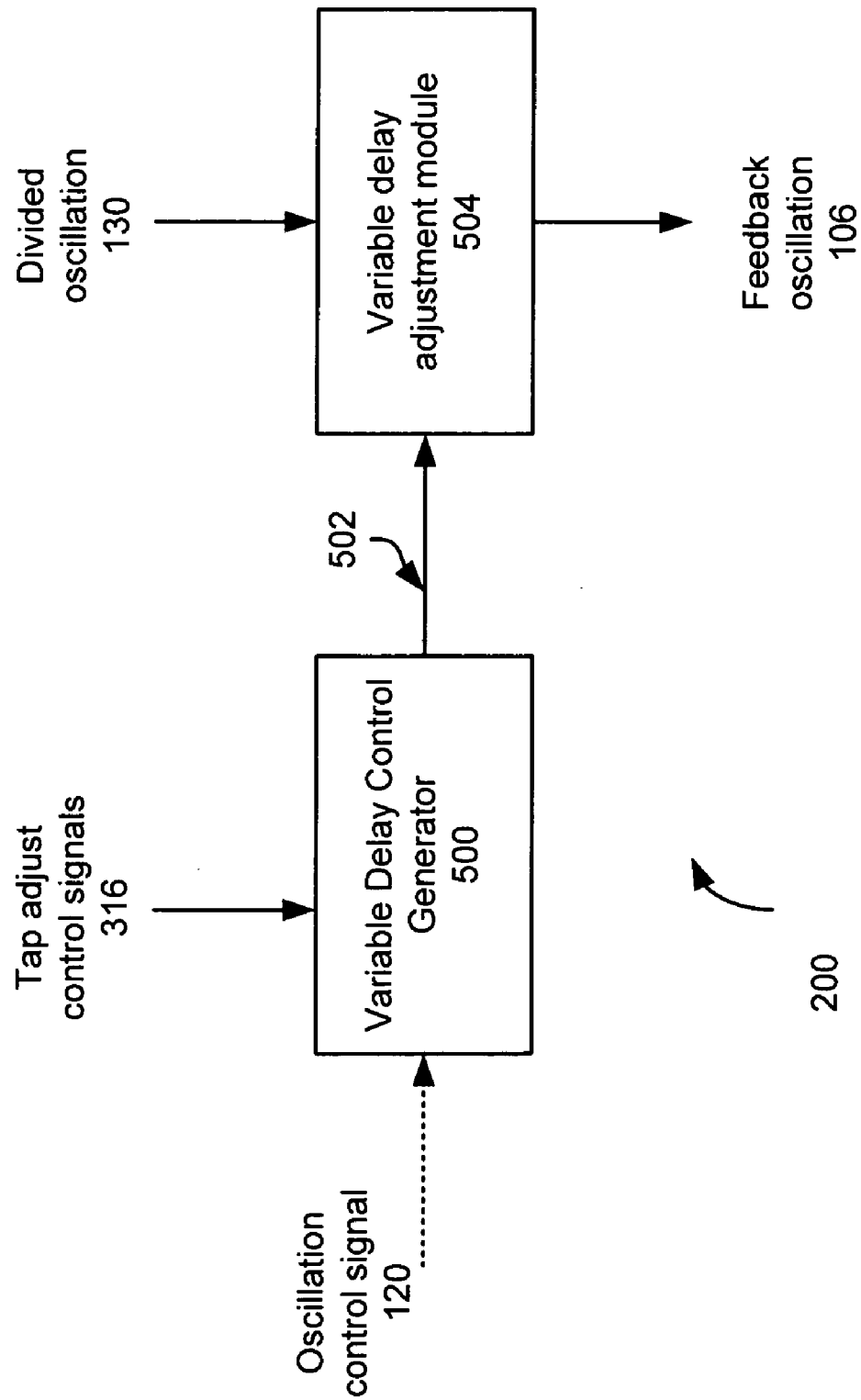
FIG. 5 presents a block diagram representation of a delay adjust module in accordance with an embodiment of the present invention.

FIG. 5 presents a block diagram representation of a delay adjust module in accordance with an embodiment of the present invention. In particular, one possible implementation is presented for delay adjust module 200. In this implementation, delay adjust module 200 includes a variable delay control generator 500, responsive to tap adjust control signals 316 for generating a variable delay control signal 502 and a variable delay adjustment module 504 for adjusting the divided oscillation 130 to produce feedback oscillation 106. Variable delay control generator 500 is optionally responsive to oscillation control signal 120, as will be discussed further in accordance with FIG. 7.

It is recognized that adjusting the output oscillation 114 using time adjustments derived from the tap delays of the ring oscillator 304, may introduce jitter into the effective output oscillation 118, and therefore noise onto output oscillation 114 itself, if the time delays corresponding to the delay stages 308 are not equal to one another. Variable delay control generator 500 generates the variable delay control signal 502 that represents a particular delay adjustment, for the particular tap that is currently selected. Considering an example where the ith tap 310 is currently selected, the variable delay adjustment corresponding to that tap can be represented as $d_i$. In this example, variable delay adjustment module 504 produces feedback oscillation 106 by introducing a variable delay adjustment, $d_i$, to divided oscillation 130.

Figure 6:
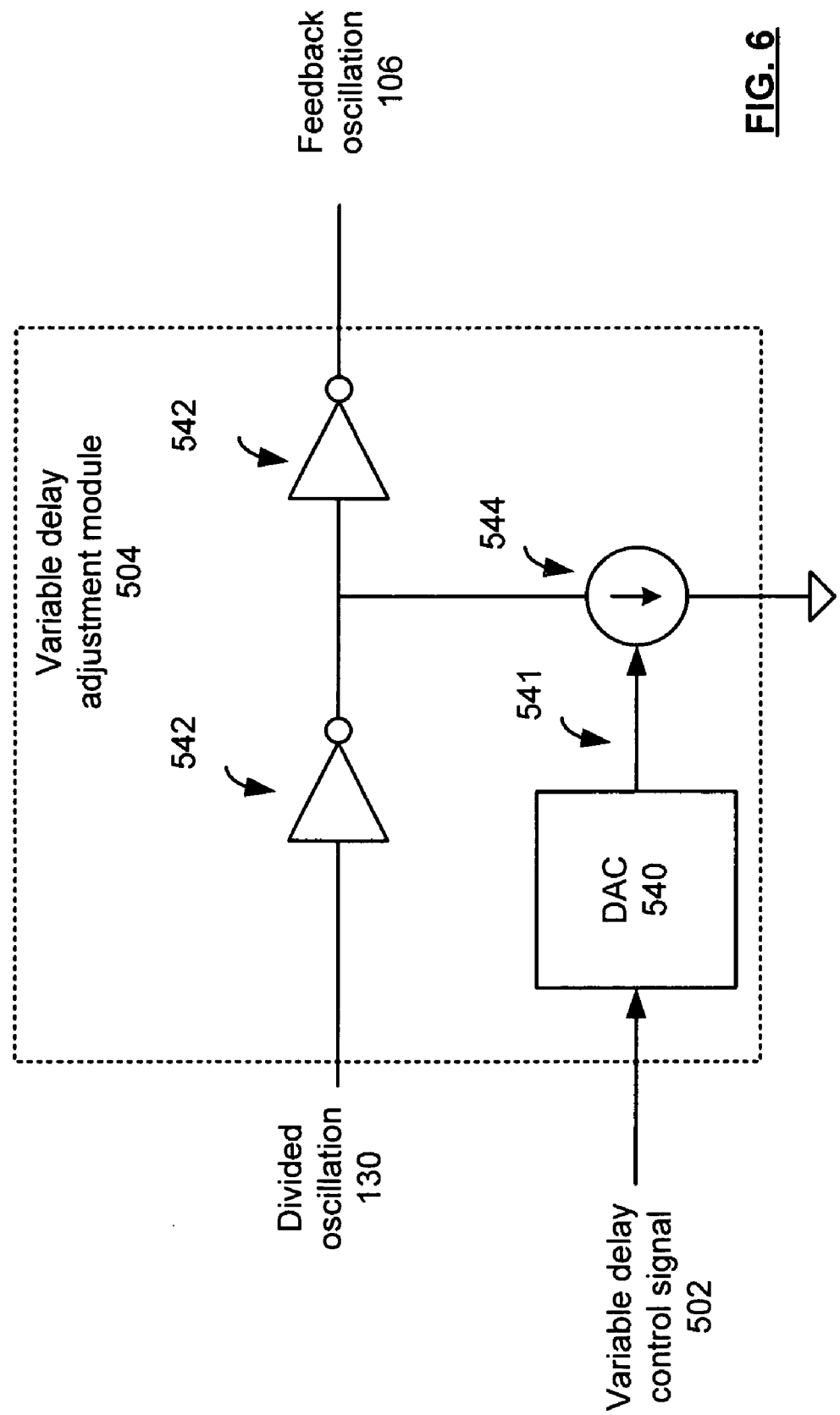
FIG. 6 presents a variable delay adjustment module in accordance with an embodiment of the present invention.

FIG. 6 presents a variable delay adjustment module in accordance with an embodiment of the present invention. In this embodiment, at least one delay stage produces the feedback oscillation 106, from divided oscillation 130 based on a variable delay adjustment. In particular, variable delay adjustment module 504 includes delay stages 542, controlled current source 544 and digital to analog converter 540. In operation, variable delay control signal is converted to an analog variable delay control signal 541 that controls the current of current source 544 so as to produce the variable delay adjustment.

While the variable delay adjustment module 504 discussed above is implemented by the analog circuit described above, in alternative embodiments of the present invention, other software, firmware or hardware could likewise be implemented as will be understood by one of ordinary skill of the art in light of the teachings presented herein.

FIG. 7 presents a block diagram representation of a memory device in accordance with an embodiment of the present invention. In particular, variable delay control generator 500 includes a memory device 550, comprising a look-up table 552 for storing a plurality of variable delay adjustments corresponding to the plurality of taps 310. The look-up table 552 is indexed by tap adjust control signals 316 that contain the value for a currently selected tap, to retrieve the corresponding variable delay adjustment in order to produce the variable delay control signal 502.

Consider the operation of the variable delay control generator 500 in light of an example. In particular consider the example presented in conjunction with FIG. 4 where the number of taps, x=15, and the sequence of tap adjust control signals 316 is:

5, 10, 0, 5, 10, 0, 5, 10, 0, . . .

The variable delay control generator 500 retrieves a sequence of variable delay adjustments based on the sequence of selected ones of the plurality of taps 310. In particular each tap value in the sequence is used to index look up table 552 to retrieve the value of variable delay adjustment for that particular tap. Variable delay control generator 500 generates variable delay control signal 502 by retrieving the sequence of variable delay adjustments shown below:

$d_5, d_{10}, d_0, d_5, d_{10}, d_0, d_5, d_{10}, d_0, \ldots$

In accordance with an embodiment of the present invention, the plurality of variable delay adjustments are generated by sampling the time delay produced each of the plurality of taps, and by calculating the variable delay adjustment $d_i$ for the ith tap as the deviation of the time delay for the ith tap, as compared with the average time delay calculated for all taps.

FIG. 8 presents a block diagram representation of a memory device in accordance with an alternative embodiment of the present invention. In particular, memory device 550 includes a look-up table 560 that is indexed by tap adjust control signals 316, containing the value for a currently selected tap, and is also indexed by the oscillation control signal 120, containing the current value of selected divisor N. In this fashion, the variable delay adjustments can vary as a function of the current value of N and therefore, vary as a function of the frequency of output oscillation 114. In this embodiment, the variable delay adjustments can be represented as $d_{i,n}$.

Consider the operation of the variable delay control generator 500 in light of an example. In particular consider the example presented in conjunction with FIG. 4 where the number of taps, x=15, N=51, and the sequence of tap adjust control signals 316 is:

5, 10, 0, 5, 10, 0, 5, 10, 0, . . .

The variable delay control generator 500 retrieves a sequence of variable delay adjustments based on the sequence of selected ones of the plurality of taps. In particular each tap value in the sequence is used to index look up table 552 to retrieve the value of variable delay adjustment for that particular tap. Variable delay control generator 500 generates variable delay control signal 502 by retrieving the sequence of variable delay adjustments shown below:

$d_{5,51}\ d_{10,51}\ d_{0,51}\ d_{5,51}\ d_{10,51}\ d_{0,51}\ d_{5,51}\ d_{10,51}\ d_{0,51} \ldots$ In accordance with an embodiment of the present invention, the plurality of variable delay adjustments are generated by sampling the time delay produced each of the plurality of taps, and for each value of N. The variable delay adjustment $d_{i,n}$ for the ith tap and for selected divisor N=n can be calculated as the deviation of the in time delay as compared with the average time delay calculated for all taps, over all values of N.

While this embodiment of the present invention is described in terms of indexing the look-up table by oscillation control signal 120, and in particular the current value of divisor N, other values that represent or control the current state of output oscillation module 112, such as control signal 110.

Figure 9:
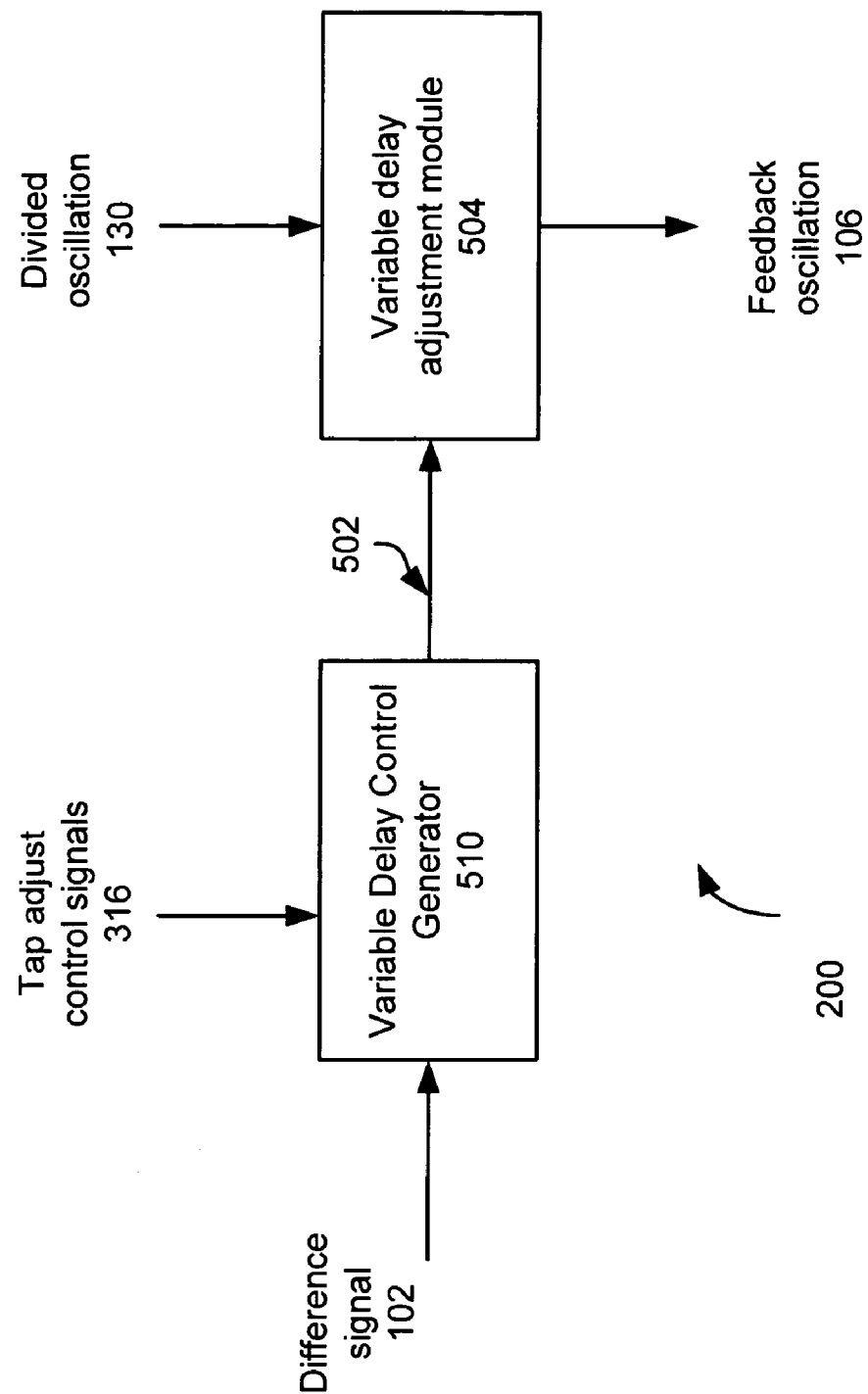
FIG. 9 presents a block diagram representation of a delay adjust module in accordance with a further embodiment of the present invention.

FIG. 9 presents a block diagram representation of a delay adjust module in accordance with a further embodiment of the present invention. Variable delay control generator 510 is included that dynamically calculates a variable delay adjustment for each of the plurality of taps. In particular, variable delay control generator 510 dynamically calculates values for variable delay control signal 502, based on difference signal 102. Because difference signal 102 represents the error between reference oscillation 100 and feedback oscillation 106, the variable delay control generator 510 can calculate a variable delay adjustment for a selected one of the plurality of taps 310 based on a value of the difference signal 102 measured when the selected one of the plurality of taps is selected.

In this configuration, the dynamic calculation of the variable delay adjustment allows the design to compensate for changes in buffer stage delays. In particular, changes in buffer stage delays that occur as a result of temperature variation, frequency, selected divisor, or degradation of the delay stages with time, or other device or operational parameters can all be compensated. When a change occurs that causes a difference in the variable delay for one of the taps, this difference is reflected in difference signal 102. The filtered values of difference signals respond to this change and cause a corresponding change in the variable delay adjustment to provide automatic correction.

Figure 10:
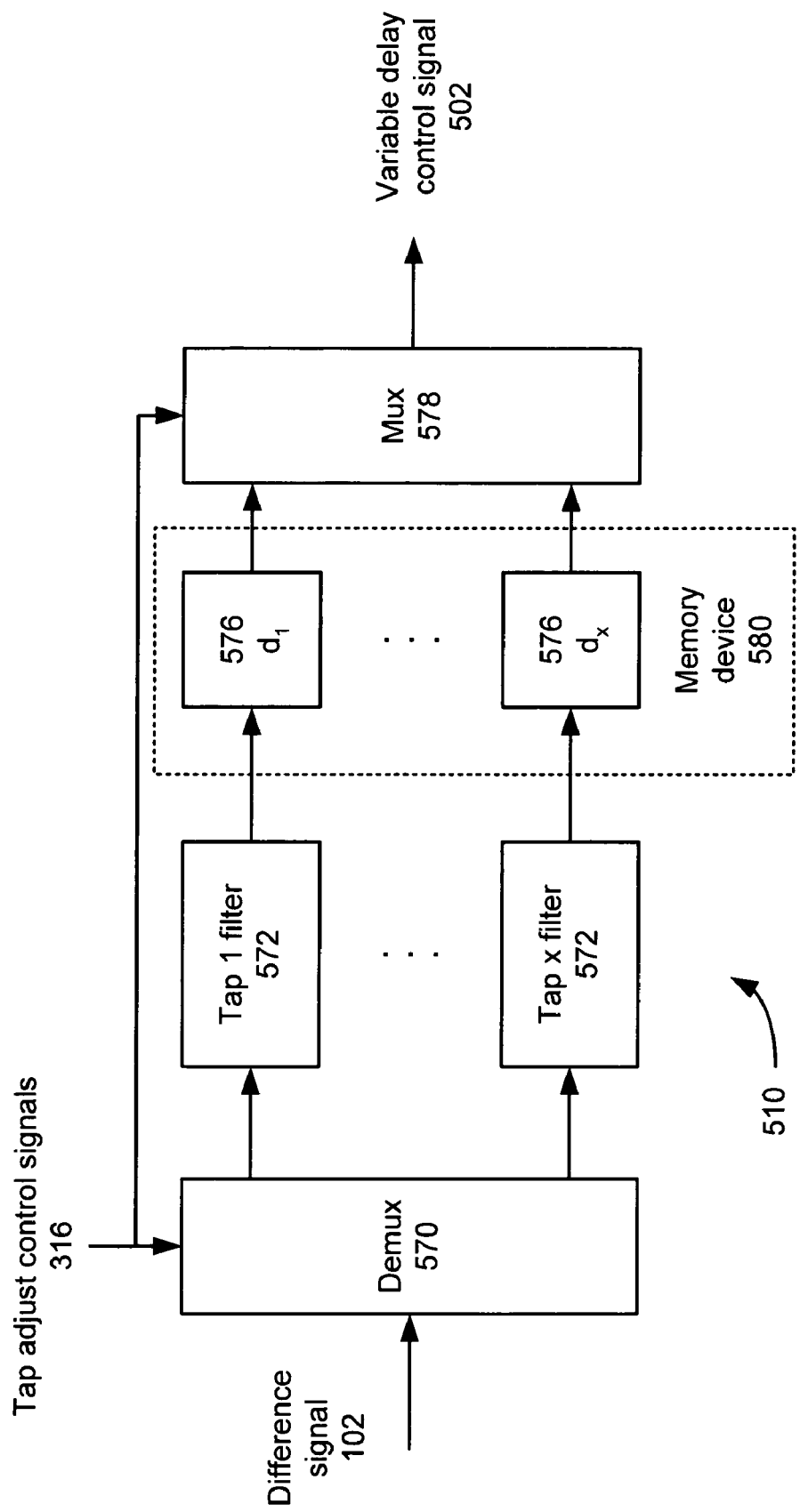
FIG. 10 presents a block diagram representation of variable delay control generator in accordance with an embodiment of the present invention.

FIG. 10 presents a block diagram representation of variable delay control generator in accordance with an embodiment of the present invention. Variable delay control generator 510 includes memory device 580 that has a plurality of individual memory elements 576 for storing a variable delay adjustment $d_i$, corresponding to each of the x taps. Multiplexer 578 is coupled to the memory device and to the tap adjust control signals 316 for retrieving a sequence of variable delay adjustments based on the sequence of selected ones of the plurality of taps.

Variable delay control generator 510 is responsive tap adjust control signals 316 that contain the value for a currently selected tap, to retrieve the corresponding variable delay adjustment in order to produce the variable delay control signal 502. In this fashion, variable delay control generator 510 operates similarly to variable delay control generator 500 presented in FIGS. 5, 7 and 8. In light of the example presented in conjunction with FIG. 4 where the number of taps, x=15, and the sequence of tap adjust control signals 316 is:

5, 10, 0, 5, 10, 0, 5, 10, 0, . . .

The variable delay control generator 510 retrieves a sequence of variable delay adjustments from memory device 580 based on the sequence of selected ones of the plurality of taps 310. In particular each tap value in the sequence is used to control multiplexer 578 to retrieve the value of variable delay adjustment for that particular tap from the corresponding individual memory element 576. Variable delay control generator 510 generates variable delay control signal 502 by retrieving the sequence of variable delay adjustments shown below:

$d_5, d_{10}, d_0, d_5, d_{10}, d_0, d_5, d_{10}, d_0, \ldots$

However, variable delay control generator 510 differs from variable delay control generator 500 by including a plurality of tap filters 572, operably coupled to the memory device 580, for calculating a variable delay adjustment for each of the plurality of taps. In addition, variable delay control generator 510 includes a demultiplexer 570, operably coupled to the difference signal 102, the tap adjust control signals 316 and each of the plurality of tap filters 572 for selecting one of the plurality of tap filters corresponding to the selected one of the plurality of taps 310.

In operation, the variable delay adjustment corresponding to the ith tap 310 is calculated by the ith tap filter 572 and stored in the ith individual memory element 576. After the tap adjust control signal selects the ith tap, demultiplexer 570 transfers the value of difference signal 102, corresponding to the error introduced in the feedback oscillation 114 by the selection of the ith tap 310, to the ith tap filter 572. In this fashion, the current value of the difference signal 102, as well as past values of the difference signal 102, also corresponding to the selection of the ith tap, can be used to calculate a new value for the ith variable delay adjustment $d_i$.

In an embodiment of the present invention, each tap filter 572 is implemented using an infinite impulse response (IIR) filter. In a preferred embodiment, each tap filter 572 includes a leaky bucket integrator that can be described in terms of its transfer function in the Z transform domain as $1/(1-(1-\alpha)Z^{-1})$. This leaky bucket integrator is, in effect, a low-pass filter with very high low frequency gain and a very low cut-off frequency. In alternative embodiments of the present invention, tap filters 572 can include other IIR filters including other low pass filters or integrators of first order or of order greater than one, in accordance with the broad scope of the present invention.

In further embodiments of the present invention, tap filters 572 can include a finite impulse response (FIR) filter that calculates a variable delay adjustment for the ith tap 310 based on the sum of a finite number of weighted past values of the difference signal 102. In this fashion, tap filters 572 can implement an average of past values, an exponentially weighted moving average of past values or implement other filter coefficients as will be understood by one skilled in the art based on the teachings presented herein.

While the description above contemplates a similar implementation for each of the tap filters 572, other configurations are possible where one or more different configurations are used for the plurality of tap filters 576. In particular, such other configurations may prove to be useful in accordance with ring oscillators where one or more of the plurality of buffers 308 are implemented differently or used in a different configuration. Also, in other embodiments, memory device 580 may not be used, and the memory included in the tap filters 572 can serve the same function as memory device 580.

Figure 11:
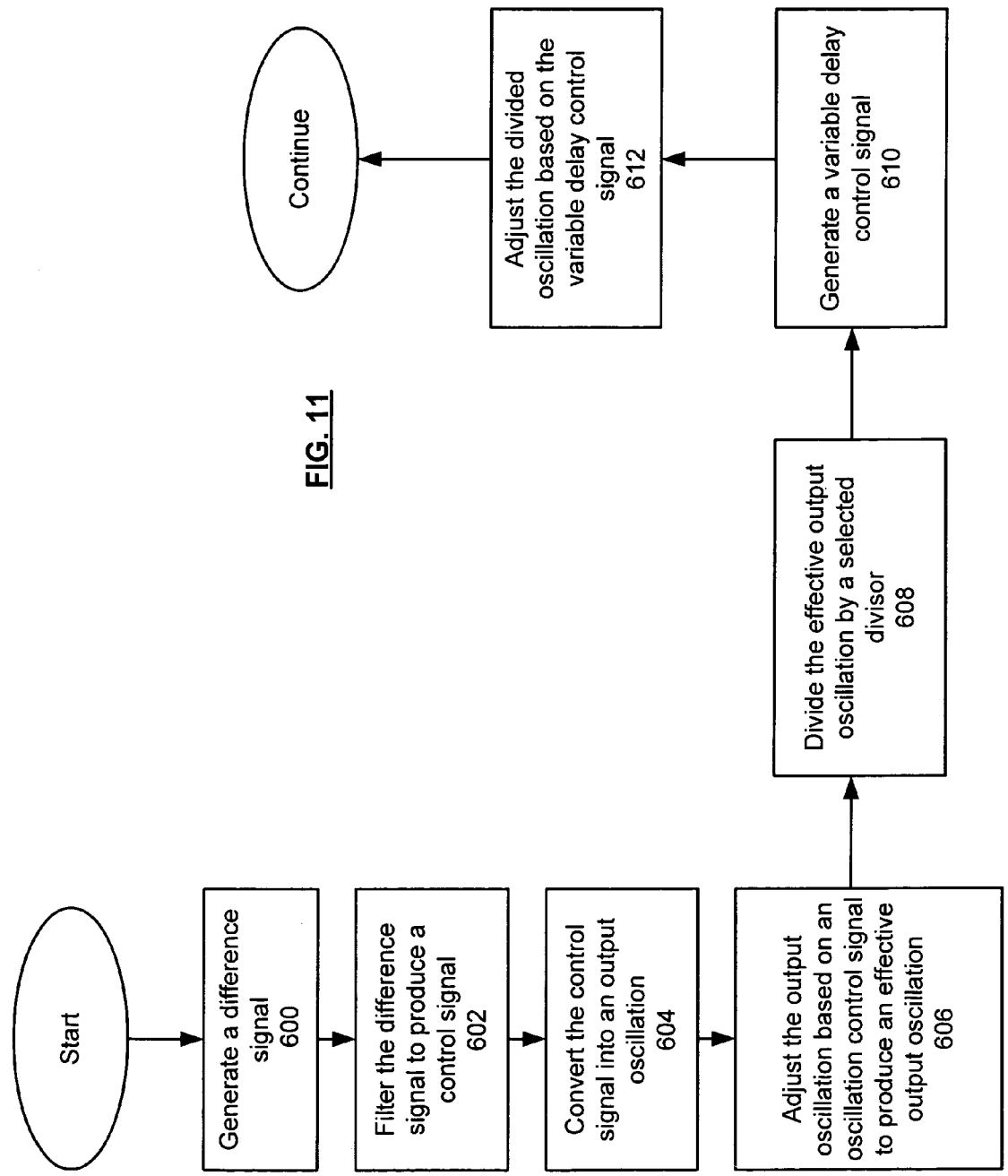
FIG. 11 presents a flowchart representation of a method for generating a controlled oscillation in accordance with an embodiment of the present invention.

FIG. 11 presents a flowchart representation of a method for generating a controlled oscillation in accordance with an embodiment of the present invention. In particular, this method can be implemented in conjunction with various embodiments of the present invention discussed herein, particularly in association with FIGS. 1–10, and 13–16. The method begins in step 600 by generating a difference signal based on at least one of a phase difference and a frequency difference between a reference oscillation and a feedback oscillation. In step 602 the method proceeds by filtering the difference signal to produce a control signal. In step 604, the control signal is converted into an output oscillation using a controlled oscillation module, such as controlled oscillation module 112 as described in its various forms. The method continues in step 606 adjusting the output oscillation to produce an effective output oscillation based on an oscillation control signal, and in step 608, by dividing the effective output oscillation by a selected divisor to produce the divided oscillation. The method proceeds in step 610 by generating a variable delay control signal and in step 612 by adjusting the feedback oscillation, as discussed in conjunction with the embodiments of the present invention presented in association with FIGS. 1–10.

In accordance with an embodiment of the present invention, step 610 includes retrieving a variable delay adjustment from a look-up table. In an alternative embodiment, step 610 includes retrieving a variable delay adjustment from a look-up table, based on the selected divisor N.

In a further embodiment of the present invention, step 610 includes calculating a variable delay adjustment. In a preferred embodiment, the variable delay adjustment is calculated based on a value of the difference signal. In addition, step 610 can include retrieving a sequence of variable delay adjustments, and filtering the difference signal.

Figure 12:
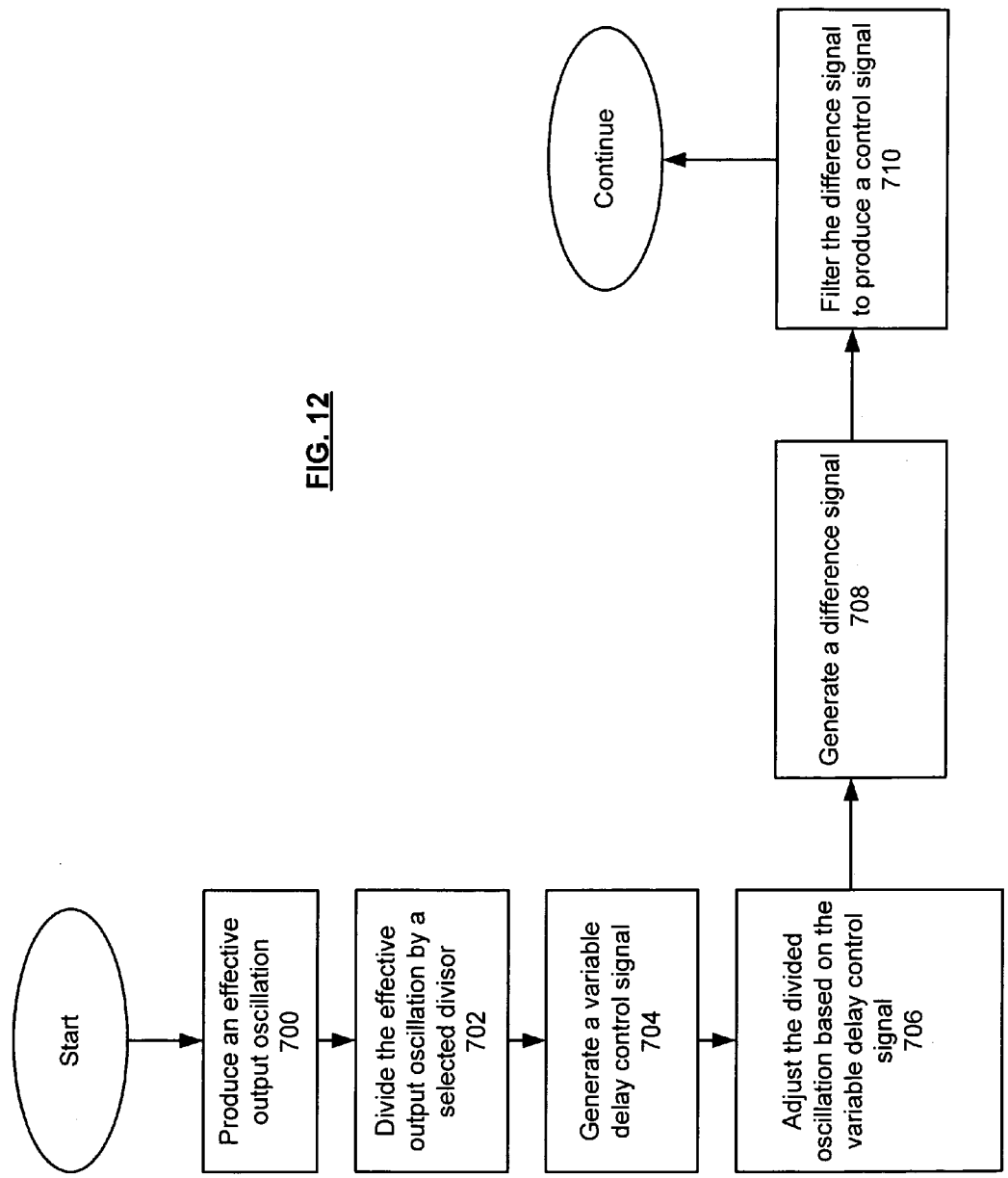
FIG. 12 presents a flowchart representation of a method for controlling the oscillation of a ring oscillator in accordance with an embodiment of the present invention.

FIG. 12 presents a flowchart representation of a method for controlling the oscillation of a ring oscillator in accordance with an embodiment of the present invention. This method can be implemented in conjunction with various embodiments of the present invention discussed herein, particularly in association with FIGS. 1–10, and 13–16 and in particular, in association with a ring oscillator, such as ring oscillator 304. In accordance with an embodiment of the present invention, the ring oscillator has a plurality of delay stages, such as delay stages 308 and a plurality of taps, such as taps 310 coupled to a corresponding plurality of outputs of the plurality of delay stages.

The method begins in step 700 by producing an effective output oscillation from the ring oscillator based on a sequence of selected ones of the plurality of taps. In step 702, effective output oscillation is divided by a selected divisor to produce a divided oscillation. In step 704 a variable delay control signal is generated, and in step 706 the divided oscillation is adjusted, based on the variable delay control signal, to produce a feedback oscillation. In step 708, a difference signal is generated based on at least one of phase a difference and a frequency difference between a reference oscillation and the feedback oscillation. In step 710, the difference signal is filtered to produce the control signal for controlling the ring oscillator.

In accordance with an embodiment of the present invention, step 704 includes retrieving a variable delay adjustment from a look-up table based on a current selection from the sequence of selected ones of the plurality of taps 310, as described in conjunction with look-up table 552. In an alternative embodiment, step 704 includes retrieving a variable delay adjustment from a look-up table, such as look-up table 560, based on the selected divisor N.

In a further embodiment of the present invention, step 704 includes calculating a variable delay adjustment for each of the plurality of taps. In a preferred embodiment, the variable delay adjustment is calculated based on a value of the difference signal measured when the selected one of the plurality of taps is selected. In addition, step 704 can include retrieving a sequence of variable delay adjustments based on the sequence of selected ones of the plurality of taps 310, and filtering the difference signal measured when the selected one of the plurality of taps is selected.

Figure 13:
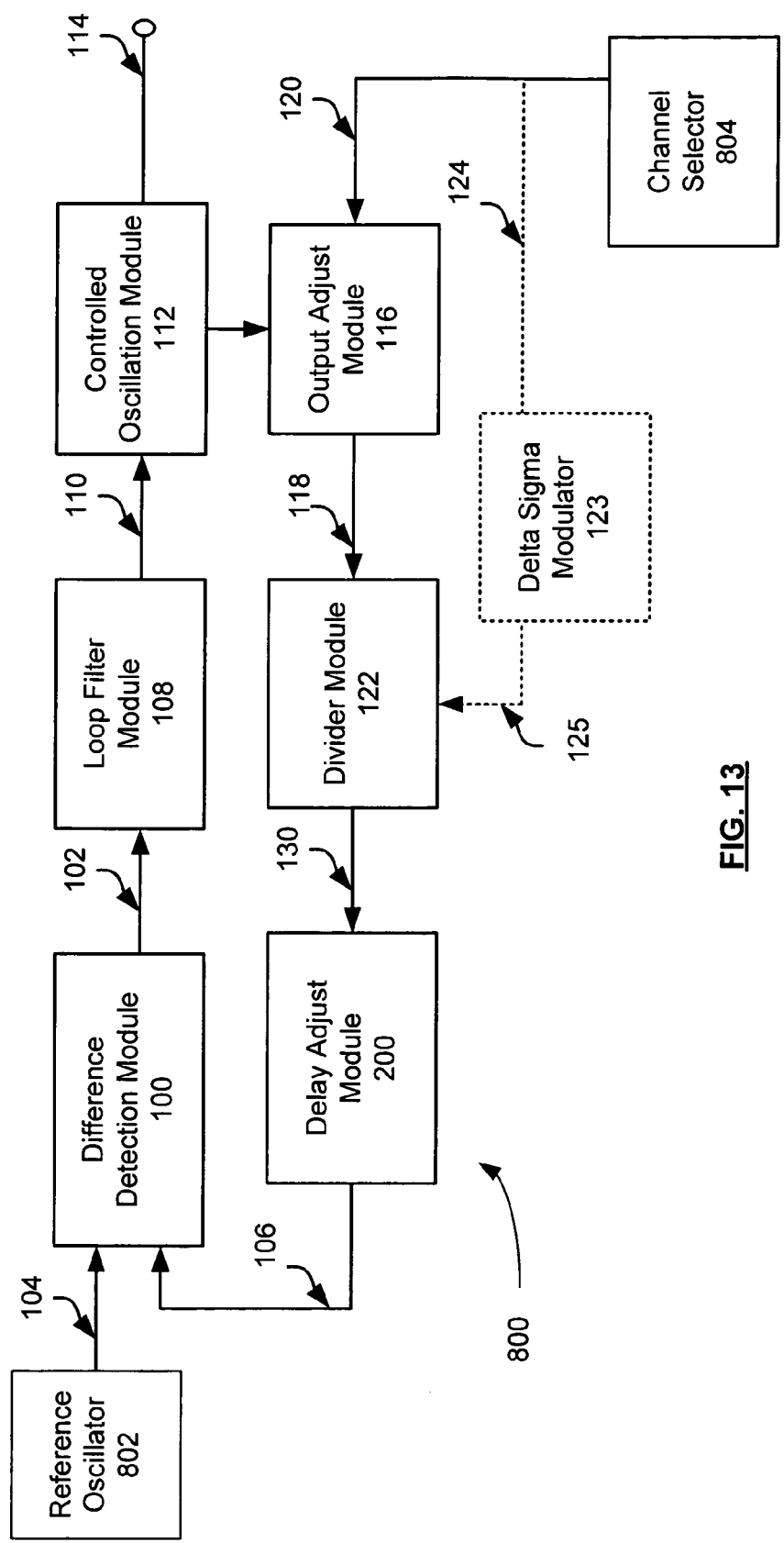
FIG. 13 presents a block diagram of a local oscillator in accordance with an embodiment of the present invention.

FIG. 13 presents a block diagram of a local oscillator in accordance with an embodiment of the present invention. In particular, a local oscillator 800 is presented for use in a radio receiver that decodes a radio signal, carrying a plurality of audio channels, into an audio output signal corresponding to a selected one of the plurality of audio channels. The local oscillator includes a reference oscillator 802 for producing a reference oscillation 104. The local oscillator further includes a channel selector 804 for generating an oscillation control signal 120 that corresponds to the selected one of the plurality of audio channels. The local oscillator further includes phase locked loop and/or methods of the present invention as implemented in one or more embodiments presented herein. In addition, optional delta sigma modulator 123 is included for accepting an m-bit signal 124 that represents an integer and fractional component of control signal 120. In response, p-bit control signal 125 is generated for divider module 122. For instance, if the control signal 120 is operative to generate a divisor of 51½, delta sigma modulator 123 generates a control signal 125 that alternates between 51 and 52, with a 50 percent duty cycle. While this configuration is described in conjunction with the embodiment of FIG. 13, it may likewise be implemented in conjunction with the other embodiments disclosed herein.

Figure 14:
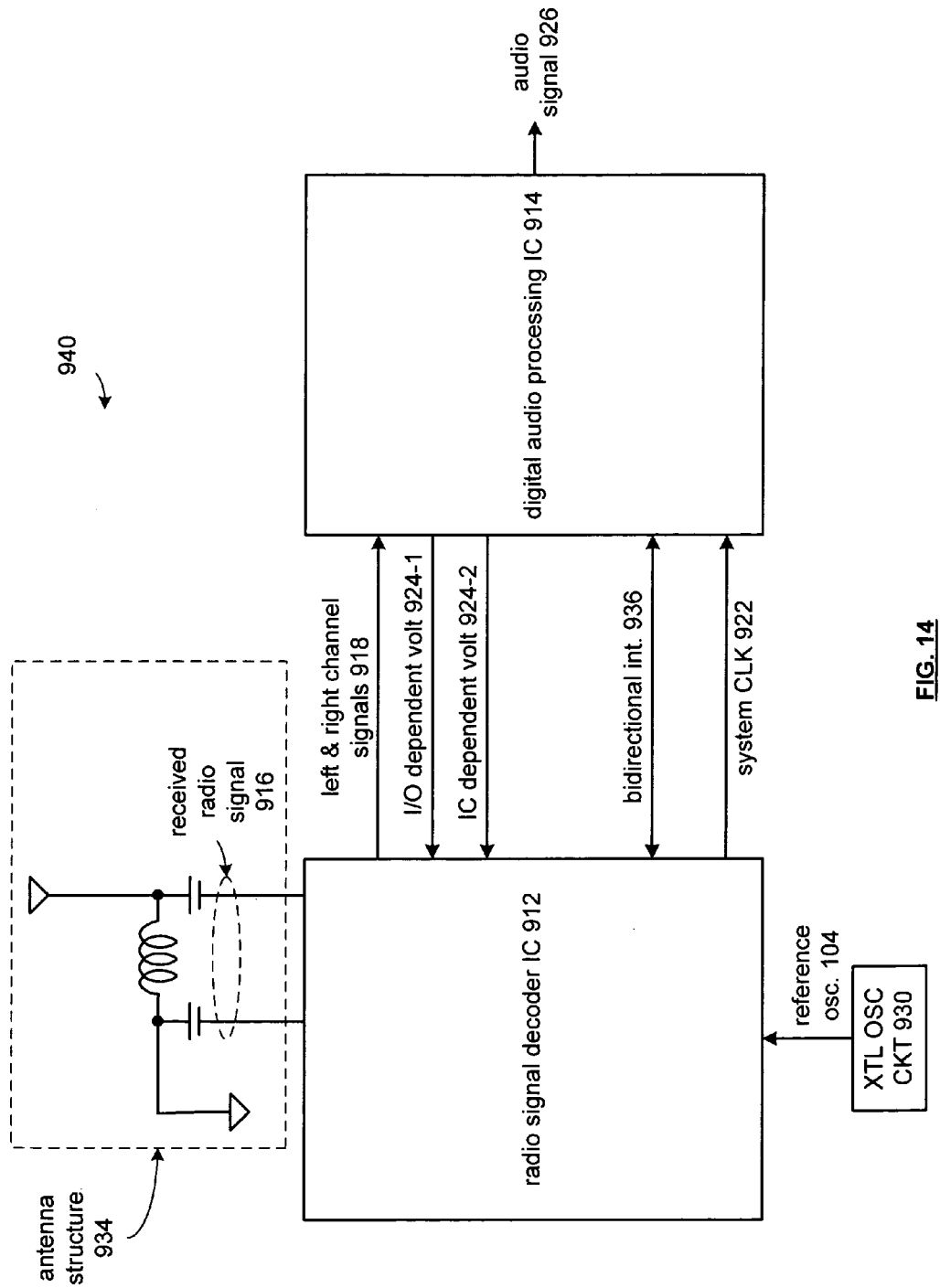
FIG. 14 presents a schematic block diagram of a handheld audio system in accordance with an embodiment of the present invention.

FIG. 14 presents a schematic block diagram of a handheld audio system in accordance with an embodiment of the present invention. In particular, handheld audio system 940 is presented that includes a radio signal decoder integrated circuit 912 and a digital audio processing integrated circuit 914. In this embodiment, the radio signal decoder integrated circuit 912 is operably coupled to a crystal oscillator circuit 930 and an antenna structure 934. The crystal oscillation circuit 930 is operably coupled to a crystal and produces therefrom a reference oscillation 104. The radio signal decoder integrated circuit 912, includes one or more phase locked loops 150 to implement at least one of a local oscillator, IF oscillator, radio receiver, and a frequency converter.

The antenna structure 934 includes an antenna, a plurality of capacitors and an inductor coupled as shown. The receive radio signal 916 is provided from the antenna structure 934 to the radio signal decoder integrated circuit 912. The radio signal decoder integrated circuit 912 converts the receive radio signal 916 into left and right channel signals 918.

The digital audio processing integrated circuit 914, via a DC-DC converter, generates an input/output (I/O) dependent supply voltage 924-1 and an integrated circuit (IC) dependent voltage 924-2 that are supplied to the radio signal decoder IC 912. In one embodiment, the I/O dependent voltage 924-1 is dependent on the supply voltage required for input/output interfacing of the radio signal decoder IC and/or the digital audio processing IC 914 (e.g., 3.3 volts) and the IC dependent voltage 924-2 is dependent on the IC process technology used to produce integrated circuits 912 and 914.

The interface between the integrated circuits 912 and 914 further includes a bi-directional interface 936. Such an interface may be a serial interface for the integrated circuits 912 and 914 to exchange control data and/or other type of data. In one embodiment, the bi-directional interface 36 may be one or more serial communication paths that are in accordance with the I²C serial transmission protocol. As one or ordinary skill in the art will appreciate, other serial transmission protocols may be used for the bi-directional interface 936 and the bi-directional interface 936 may include one or more serial transmission paths.

Figure 15:
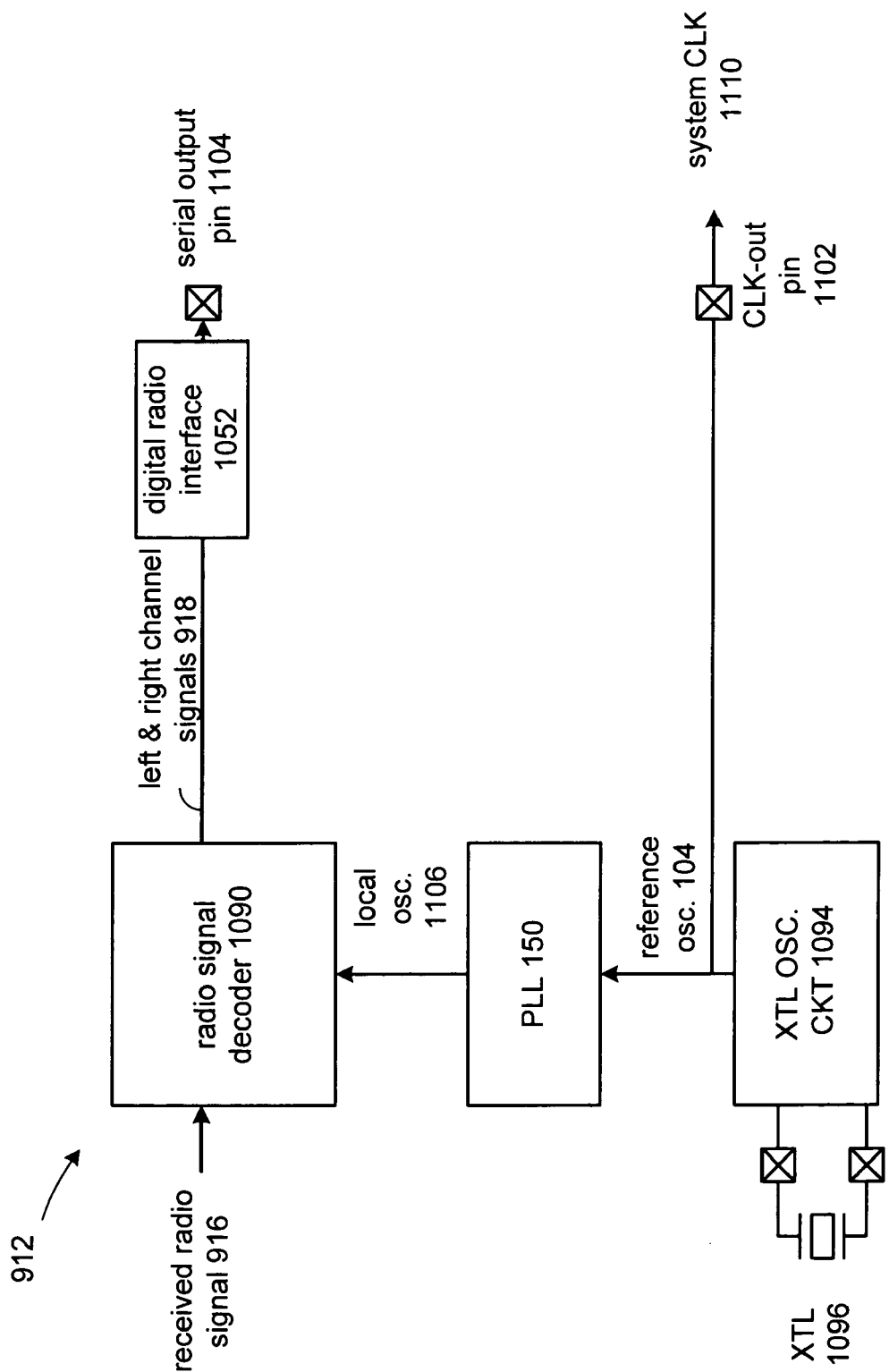
FIG. 15 presents a schematic block diagram of a radio signal decoder in accordance with an embodiment of the present invention.

FIG. 15 presents a schematic block diagram of a radio signal decoder in accordance with an embodiment of the present invention. In particular, an implementation of embodiment of the radio signal decoder integrated circuit 912 is presented that includes the digital radio interface 1052, a crystal oscillation circuit (XTL OSC CKT) 1094, a phase locked loop (PLL) 150 and a radio signal decoder 1090. The crystal oscillation circuit 1094 is operably coupled, via integrated circuit pins, to an external crystal 1096 to produce a reference oscillation 104. The rate of the reference oscillation 104 is based on the properties of the external crystal 1096 and, as such, may range from a few kilo-Hertz to hundreds of mega-Hertz. In this embodiment, the reference oscillation 104 produces the system output clock 1110, which is outputted via a clock output (CLK_out) pin 1102. As one of ordinary skill in the art will appreciate, the system clock 1110 may be identical to the reference oscillation 104, may have a rate that is a multiple of reference oscillation 104, may have a rate that is a fraction of reference oscillation 104, may have a phase shift with respect to the reference oscillation, or a combination thereof.

The phase locked loop 150 produces a local oscillation 1106 from the reference oscillation 104. The rate of the local oscillation corresponds to a difference between an intermediate frequency (IF) and a carrier frequency of the received radio signal 916. For instance, if the desired IF is 2 MHz and the carrier frequency of the received radio signal 916 is 101.5 MHz, the local oscillation is 99.5 MHz (i.e., 101.5 MHz-2 MHz). As one of ordinary skill in the art will appreciate, the intermediate frequency may range from DC to a few tens of MHz and the carrier frequency of the received radio signal 916 is dependent upon the particular type of radio signal (e.g., AM, FM, satellite, cable, etc.).

The radio signal decoder 1090 converts the received radio signal 916, which may be an AM radio signal, FM radio signal, satellite radio signal, cable radio signal, into the left and right channel signals 918 in accordance with the local oscillation 1106. The radio signal decoder 1090 provides the left and right channel signals to the digital radio interface 1052 for outputting via a serial output pin 1104. The serial output pin 1104 may include one or more serial input/output connections.

Figure 16:
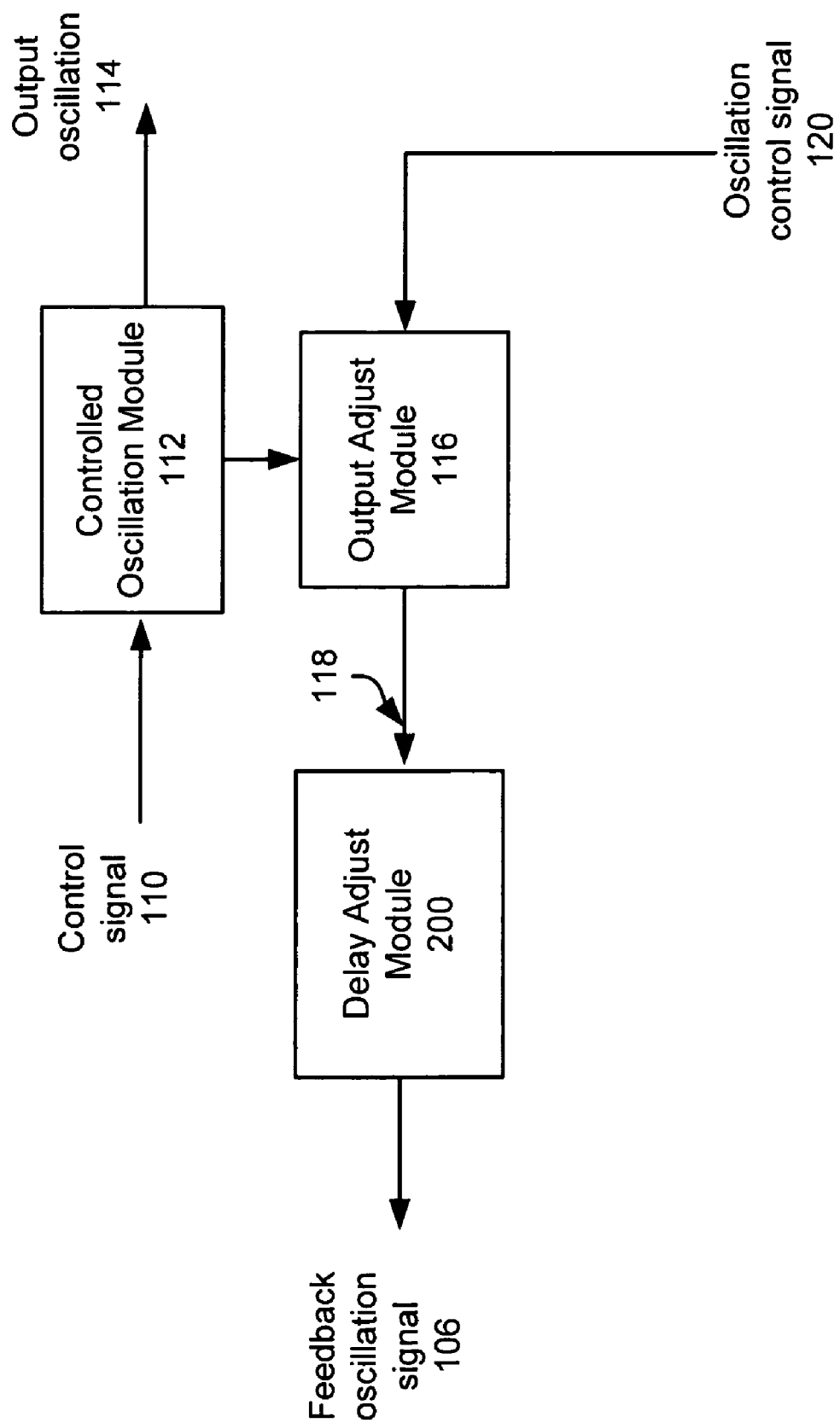
FIG. 16 presents a block diagram representation of a controlled oscillator in accordance with an embodiment of the present invention

FIG. 16 presents a block diagram representation of a controlled oscillator in accordance with an embodiment of the present invention. Controlled oscillation module 112 produces the output oscillation 114, based on a control signal 110. Controlled oscillation module, can be implemented with a plurality of delay stages, such as delay stages 308 and a plurality of taps, such as taps 310 coupled to a corresponding plurality of outputs of the plurality of delay stages.

Output oscillation adjust module 116 is operably coupled to the controlled oscillation module 112 for producing an effective output oscillation 118 based on an oscillation control signal 120. The output oscillation adjust module 116 can include an output select block, such as output select block 312, operably coupled to the plurality of taps, for producing the effective output oscillation 118 from a sequence of selected taps from the plurality of taps. Output oscillation adjust module 116 can include a tap adjust control generator, such as tap adjust control generator 314, responsive to the oscillation control signal 120, for generating a sequence of tap adjust control signals, such as tap adjust control signals 316, that command the output select block to select the sequence of selected taps from the plurality of taps.

Delay adjust module 200 produces a feedback oscillation 106 by adjusting the effective oscillation 118, as previously described in conjunction with various embodiments of the present invention. Likewise, control signal 110 can be derived based on the feedback oscillation 106, for instance, as described in conjunction with FIGS. 1–2 and 11–12.

In preferred embodiments, the various circuit components of the phase locked loop circuit 150 and other circuits are implemented using 0.08 to 0.35 micron CMOS technology. Provided however that other circuit technologies, both integrated or non-integrated, may be used within the broad scope of the present invention. Likewise, various embodiments described herein can also be implemented as software programs running on a computer processor. It should also be noted that the software implementations of the present invention can be stored on a tangible storage medium such as a magnetic or optical disk, read-only memory or random access memory and also be produced as an article of manufacture.

Thus, there has been described herein an apparatus and method, as well as several embodiments including a preferred embodiment, for implementing a phase locked loop and a radio receiver. Various embodiments of the present invention herein-described have features that distinguish the present invention from the prior art.

It will be apparent to those skilled in the art that the disclosed invention may be modified in numerous ways and may assume many embodiments other than the preferred forms specifically set out and described above. Accordingly, it is intended by the appended claims to cover all modifications of the invention which fall within the true spirit and scope of the invention.

What is claimed is:

1. A phase locked loop comprises:
   a difference detection module operably coupled to determine a difference signal based on at least one of a phase difference and a frequency difference between a reference oscillation and a feedback oscillation;
   a loop filter module operably coupled to convert the difference signal into a control signal;
   a ring oscillator having a plurality of delay stages and a plurality of taps coupled to a corresponding plurality of outputs of the plurality of delay stages, the ring oscillator for producing an output oscillation based the control signal;
   an output oscillation adjust module operably coupled to the ring oscillator for producing an effective output oscillation based on an oscillation control signal, wherein the output oscillation adjust module includes an output select block, operably coupled to the plurality of taps, for producing the effective output oscillation from a sequence of selected taps from the plurality of taps, and a tap adjust control generator, responsive to the oscillation control signal for generating a sequence of tap adjust control signals that command the output select block to select the sequence of selected taps from the plurality of taps;
   a divider module operably coupled to convert the effective output oscillation into a divided oscillation; and
   a delay adjust module operably coupled to the divider module for producing the feedback oscillation by adjusting the divided oscillation, wherein the delay adjust module includes a variable delay control generator for generating a variable delay control signal and a variable delay adjustment module for adjusting the divided oscillation.

2. The phase locked loop of claim 1 wherein the variable delay control generator includes a memory device for storing a variable delay adjustment for each of the plurality of taps.

3. The phase locked loop of claim 2 wherein the memory device includes a look-up table that is indexed based on the sequence of selected taps.

4. The phase locked loop of claim 2 wherein the memory device includes a look-up table that is indexed based on the selected divisor.

5. The phase locked loop of claim 2 wherein the variable delay control generator calculates a variable delay adjustment for each of the plurality of taps.

6. The phase locked loop of claim 5 wherein the variable delay control generator calculates the variable delay adjustment for a selected one of the plurality of taps based on a value of the difference signal measured when the selected one of the plurality of taps is selected.

7. The phase locked loop of claim 6 wherein the variable delay control generator includes a plurality of tap filters, operably coupled to the memory device, for calculating a variable delay adjustment for each of the plurality of taps.

8. The phase locked loop of claim 7 wherein the variable delay control generator includes a demultiplexer, operably coupled to the difference signal, the tap adjust control signals and each of the plurality of tap filters for selecting one of the plurality of tap filters corresponding to the selected one of the plurality of taps.

9. The phase locked loop of claim 6 wherein at least one of the plurality of tap filters includes a finite impulse response filter.

10. The phase locked loop of claim 6 wherein at least one of the plurality of tap filters includes an infinite impulse response filter.

11. The phase locked loop of claim 6 wherein the infinite impulse response filter includes a leaky bucket integrator.

12. The phase locked loop of claim 2 wherein the variable delay control generator includes a multiplexer, coupled to the memory device and to the tap adjust control signals for retrieving a sequence of variable delay adjustments based on the sequence of selected ones of the plurality of taps.

13. The phase locked loop of claim 1 wherein the variable delay adjustment module includes:
   at least one delay stage, operable coupled to the divided oscillation, for producing the feedback oscillation based on the variable delay adjustment; and
   a controlled current source, operably coupled to the at least one delay stage, for controlling the at least one delay stage to produce the variable delay adjustment.

14. A method for controlling the oscillation of a ring oscillator, the ring oscillator having a plurality of delay stages and a plurality of taps coupled to a corresponding plurality of outputs of the plurality of delay stages, the ring oscillator for producing an output oscillation in response to a control signal, the method comprising the steps of:
   producing an effective output oscillation from the ring oscillator based on a sequence of selections of the plurality of taps;
   dividing the effective output oscillation by a selected divisor to produce a divided oscillation;
   generating a variable delay control signal;
   adjusting the divided oscillation based on the variable delay control signal to produce a feedback oscillation;
   generating a difference signal based on at least one of phase a difference and a frequency difference between a reference oscillation and the feedback oscillation;

filtering the difference signal to produce the control signal.

15. The method of claim 14 wherein the step of generating a variable delay control signal includes retrieving a variable delay adjustment from a look-up table.

16. The method of claim 15 wherein the step of generating a variable delay control signal further includes retrieving a variable delay adjustment from a look-up table based on a current selection from the sequence of selections of the plurality of taps.

17. The method of claim 16 wherein the step of generating a variable delay control signal further includes retrieving the variable delay adjustment from a look-up table based on the selected divisor.

18. The method of claim 14 wherein the step of generating a variable delay control signal includes the step of:
calculating a variable delay adjustment for each of the plurality of taps.

19. The method of claim 14 wherein the step of generating a variable delay control signal includes the step of:
calculating a variable delay adjustment for a selected one of the plurality of taps based on a value of the difference signal measured when the selected one of the plurality of taps is selected.

20. The method of claim 19 wherein the step of generating a variable delay control signal includes the step of:
retrieving a sequence of variable delay adjustments based on the sequence of selected ones of the plurality of taps.

21. The method of claim 14 wherein the step of generating a variable delay control signal includes the step of:
calculating a current variable delay adjustment for a selected one of the plurality of taps based by filtering the difference signal measured when the selected one of the plurality of taps is selected.

22. A method for producing an output oscillation, the method comprising the steps of:
generating a difference signal based on at least one of a phase difference and a frequency difference between a reference oscillation and a feedback oscillation;
filtering the difference signal to produce a control signal;
converting the control signal into an output oscillation;
adjusting the output oscillation to produce an effective output oscillation based on an oscillation control signal;
dividing the effective output oscillation by a selected divisor to produce a divided oscillation;
generating a variable delay control signal; and
adjusting the divided oscillation based on the variable delay control signal to produce the feedback oscillation.

23. The method of claim 22 wherein the step of generating a variable delay control signal includes retrieving a variable delay adjustment from a look-up table.

24. The method of claim 23 wherein the step of generating a variable delay control signal further includes retrieving the variable delay adjustment from a look-up table based on the selected divisor.

25. The method of claim 22 wherein the step of generating a variable delay control signal includes the step of:
calculating a variable delay adjustment based on a value of the difference signal.

26. The method of claim 25 wherein the step of generating a variable delay control signal includes the step of:
retrieving a sequence of variable delay adjustments.

27. The method of claim 22 wherein the step of generating a variable delay control signal includes the step of:
calculating a current variable delay adjustment by filtering the difference signal.

28. A local oscillator for use in a radio receiver for demodulating a radio signal that carries a plurality of audio channels into an audio output signal corresponding to a selected one of the plurality of audio channels, the local oscillator comprises:
a reference oscillator for producing a reference oscillation;
a channel selector for generating an oscillation control signal that corresponds to the selected one of the plurality of audio channels;
a difference detection module operably coupled to determine a difference signal based on at least one of a phase difference and a frequency difference between the reference oscillation and a feedback oscillation;
a loop filter module operably coupled to convert the difference signal into a control signal;
a controlled oscillation module operably coupled to convert the control signal into an output oscillation;
an output oscillation adjust module operably coupled to the controlled oscillation module to produce an effective output oscillation based on an oscillation control signal; and
a divider module operably coupled to convert the effective output oscillation into a divided oscillation; and
a delay adjust module operably coupled to the divider module for producing the feedback oscillation by adjusting the divided oscillation.

29. The local oscillator of claim 28 wherein the controlled oscillation module includes a ring oscillator having a plurality of delay stages and a plurality of taps coupled to a corresponding plurality of outputs of the plurality of delay stages.

30. The local oscillator of claim 29 wherein output oscillation adjust module includes an output select block, operably coupled to the plurality of taps, for producing the effective output oscillation from one of the plurality of taps.

31. The local oscillator of claim 30 wherein the output oscillation adjust module includes a tap adjust control generator, responsive to the oscillation control signal for generating a sequence of tap adjust control signals that command the output select block to select a corresponding sequence of selected taps from the plurality of taps.

32. The local oscillator of claim 31 wherein the tap adjust control generator includes an integrator having an integrator output, responsive to the oscillation control signal and the reference oscillation, and a modulo(x) module for producing the sequence of tap adjust control signals based on the integrator output, wherein the value of x is equal to the number of the plurality of taps.

33. The local oscillator of claim 31 wherein the delay adjust module includes a variable delay control generator for generating a variable delay control signal and a variable delay adjustment module for adjusting the divided oscillation.

34. The phase locked loop of claim 33 wherein the variable delay control generator includes a memory device for storing a variable delay adjustment for each of the plurality of taps.

35. The phase locked loop of claim 34 wherein the memory device includes a look-up table that is indexed based on the sequence of selected taps.

36. The phase locked loop of claim 34 wherein the variable delay control generator calculates a variable delay adjustment for each of the plurality of taps.

37. The phase locked loop of claim 36 wherein the variable delay control generator calculates a variable delay adjustment for a selected one of the plurality of taps based on a value of the difference signal measured when the selected one of the plurality of taps is selected.

38. The phase locked loop of claim 37 wherein the variable delay control generator includes a plurality of tap filters, operably coupled to the memory device, for calculating a variable delay adjustment for each of the plurality of taps.

39. The phase locked loop of claim 38 wherein the variable delay control generator includes a demultiplexer, operably coupled to the difference signal, the tap adjust control signals and each of the plurality of tap filters for selecting one of the plurality of tap filters corresponding to the selected one of the plurality of taps.

40. The phase locked loop of claim 34 wherein the variable delay control generator includes a multiplexer, coupled to the memory device and to the tap adjust control signals for retrieving a sequence of variable delay adjustments based on the sequence of selected ones of the plurality of taps.

41. The phase locked loop of claim 33 wherein the variable delay adjustment module includes:
at least one delay stage, operable coupled to a the divided oscillation, for producing the feedback oscillation based on the variable delay adjustment; and
a controlled current source, operably coupled to the at least one delay stage, for controlling the at least one delay stage to produce the variable delay adjustment.

42. A controlled oscillator comprises:
a controlled oscillation module having a plurality of delay stages and a plurality of taps coupled to a corresponding plurality of outputs of the plurality of delay stages, the controlled oscillation module producing the output oscillation, based on a control signal;
an output oscillation adjust module operably coupled to the controlled oscillation module for producing an effective output oscillation based on an oscillation control signal, wherein the output oscillation adjust module includes an output select block, operably coupled to the plurality of taps, for producing the effective output oscillation from a sequence of selected taps from the plurality of taps, and a tap adjust control generator, responsive to the oscillation control signal for generating a sequence of tap adjust control signals that command the output select block to select the sequence of selected taps from the plurality of taps; and
a delay adjust module for producing a feedback oscillation by adjusting the effective oscillation;
wherein the control signal is based on the feedback oscillation.

43. The controlled oscillator of claim 42 wherein the delay adjust module includes a variable delay control generator for generating a variable delay control signal and a variable delay adjustment module for adjusting the divided oscillation.

44. The phase locked loop of claim 43 wherein the variable delay control generator includes a memory device for storing a variable delay adjustment for each of the plurality of taps.

45. The phase locked loop of claim 44 wherein the variable delay control generator includes a plurality of tap filters, operable coupled to the memory device, for calculating a variable delay adjustment for each of the plurality of taps by filtering the difference signal measured when the selected one of the plurality of taps is selected.

46. The phase locked loop of claim 45 wherein the variable delay control generator includes a demultiplexer, operably coupled to the difference signal, the tap adjust control signals and each of the plurality of tap filters for selecting one of the plurality of tap filters corresponding to the selected one of the plurality of taps.

47. The phase locked loop of claim 46 wherein at least one of the plurality of tap filters includes a leaky bucket integrator.

48. The phase locked loop of claim 44 wherein the variable delay control generator includes a multiplexer, coupled to the memory device and to the tap adjust control signals for retrieving a sequence of variable delay adjustments based on the sequence of selected ones of the plurality of taps.

* * * * *